(12) United States Patent
Patel et al.

(10) Patent No.: US 11,810,877 B2
(45) Date of Patent: Nov. 7, 2023

(54) INTEGRATED DECOUPLING CAPACITORS

(71) Applicant: Cisco Technology, Inc., San Jose, CA (US)

(72) Inventors: Vipulkumar K. Patel, Breinigsville, PA (US); Mark A. Webster, Bethlehem, PA (US); Craig S. Appel, Macungie, PA (US)

(73) Assignee: Cisco Technology, Inc., San Jose, CA (US)

( * ) Notice: Subject to any disclaimer, the term of this patent is extended or adjusted under 35 U.S.C. 154(b) by 18 days.

(21) Appl. No.: 17/454,937

(22) Filed: Nov. 15, 2021

(65) Prior Publication Data

US 2022/0077084 A1 Mar. 10, 2022

Related U.S. Application Data

(62) Division of application No. 16/809,446, filed on Mar. 4, 2020, now Pat. No. 11,227,847.

(51) Int. Cl.
| | |
|---|---|
| H01L 23/64 | (2006.01) |
| H01L 23/00 | (2006.01) |
| H01L 23/522 | (2006.01) |
| H01L 21/20 | (2006.01) |
| G02B 6/122 | (2006.01) |
| G02B 6/12 | (2006.01) |
| G02B 6/30 | (2006.01) |

(52) U.S. Cl.
CPC .......... H01L 24/01 (2013.01); H01L 21/2007 (2013.01); H01L 23/5222 (2013.01); G02B 6/1225 (2013.01); G02B 6/305 (2013.01); G02B 2006/12061 (2013.01)

(58) Field of Classification Search
None
See application file for complete search history.

(56) References Cited

U.S. PATENT DOCUMENTS

| | | | |
|---|---|---|---|
| 10,698,156 B2* | 6/2020 | Coolbaugh | .......... G02B 6/4232 |
| 2010/0308663 A1* | 12/2010 | Agarwal | ................. H01L 22/22 |
| | | | 307/99 |
| 2011/0108938 A1* | 5/2011 | Nozaki | ............. H01L 27/14629 |
| | | | 257/E31.127 |
| 2013/0320194 A1* | 12/2013 | Chen | ....................... H01L 25/50 |
| | | | 257/E31.127 |
| 2018/0138225 A1* | 5/2018 | Kim | ....................... H04N 25/75 |
| 2018/0166490 A1* | 6/2018 | Wakiyama | ............. H01L 24/03 |
| 2019/0043903 A1* | 2/2019 | Gambino | .......... H01L 27/14609 |
| 2020/0127029 A1* | 4/2020 | Meynants | ......... H01L 27/14609 |

* cited by examiner

*Primary Examiner* — Benjamin P Sandvik
(74) *Attorney, Agent, or Firm* — Patterson + Sheridan, LLP

(57) ABSTRACT

Embodiments herein describe providing a decoupling capacitor on a first wafer (or substrate) that is then bonded to a second wafer to form an integrated decoupling capacitor. Using wafer bonding means that the decoupling capacitor can be added to the second wafer without having to take up space in the second wafer. In one embodiment, after bonding the first and second wafers, one or more vias are formed through the second wafer to establish an electrical connection between the decoupling capacitor and bond pads on a first surface of the second wafer. An electrical IC can then be flip chipped bonded to the first surface. As part of coupling the decoupling capacitor to the electrical IC, the decoupling capacitor is connected between the rails of a power source (e.g., VDD and VSS) that provides power to the electrical IC.

20 Claims, 8 Drawing Sheets

INTEGRATED DECOUPLING CAPACITORS

CROSS-REFERENCE TO RELATED APPLICATIONS

This application is a divisional of co-pending U.S. patent application Ser. No. 16/809,446, filed Mar. 4, 2020. The aforementioned related patent application is herein incorporated by reference in its entirety.

TECHNICAL FIELD

Embodiments presented in this disclosure generally relate to using wafer bonding to integrate a decoupling capacitor into a platform.

BACKGROUND

Decoupling capacitors are commonly used for suppression of noise and are ideally placed as close as possible to the device requiring the decoupled signal. Placing the decoupling capacitors close to the device minimizes the amount of line inductance and series resistance between the decoupling capacitor and the device. In some situations, a decoupling capacitor is connected between power rails (e.g., VDD and VSS) used to power circuitry in an electrical integrated circuit (IC). However, the decoupling capacitors may be large to have sufficient capacitance but available real estate within electrical ICs is often limited. As a result, external decoupling capacitors are often used to add to the capacitance provided by internal decoupling capacitors. However, using external decoupling capacitors reduces their effectiveness since they are typically much farther from the circuitry relative to an internal decoupling capacitor.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate typical embodiments and are therefore not to be considered limiting; other equally effective embodiments are contemplated.

To facilitate understanding, identical reference numerals have been used, where possible, to designate identical elements that are common to the figures. It is contemplated that elements disclosed in one embodiment may be beneficially used in other embodiments without specific recitation.

DESCRIPTION OF EXAMPLE EMBODIMENTS

Overview

Figure 1:
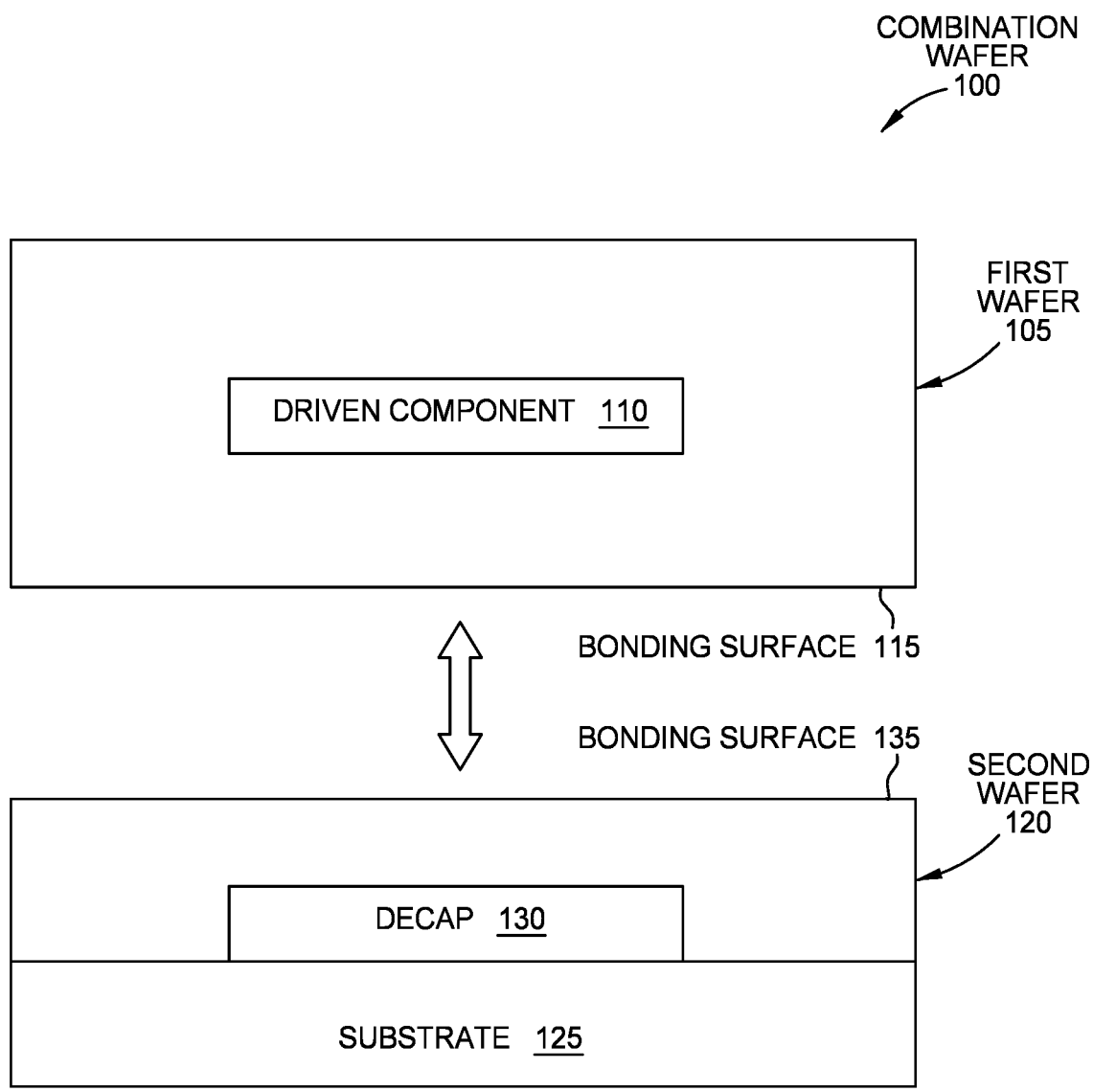
FIG. 1 illustrates bonding two wafers to form an integrated decoupling capacitor, according to one embodiment described herein.

One embodiment herein is a combination wafer that includes a second wafer comprising an electrically driven component and a first wafer comprising a decoupling capacitor where the first wafer and the second wafer are directly bonded along a wafer bond line. Further, the first wafer comprises a plurality of vias that electrically connect the decoupling capacitor in the second wafer to bond pads disposed on a first side of the first wafer that is opposite the wafer bond line.

Another embodiment herein is a platform that includes a first wafer portion comprising an electrically driven component, a second wafer portion comprising a decoupling capacitor where the first wafer portion and the second wafer portion are bonded along a bond line and where the first wafer portion comprises a plurality of vias that electrically connect the decoupling capacitor portion to bond pads disposed on a first side of the first wafer portion that is opposite the bond line. The platform also includes an electrical IC coupled to the bond pads.

One embodiment herein is a combination wafer that includes a second wafer comprising an electrically driven component and a first wafer comprising a decoupling capacitor where the first wafer and the second wafer are wafer bonded along a wafer bond line. Further, the first wafer comprises a plurality of vias that electrically connect the decoupling capacitor in the second wafer to bond pads disposed on a first side of the first wafer that is opposite the wafer bond line.

Example Embodiments

Embodiments herein describe providing a decoupling capacitor on a first wafer (or substrate) that is then bonded to a second wafer to form an integrated decoupling capacitor. Using wafer bonding means that the decoupling capacitor can be functionally coupled to the second wafer without having to take up space in the second wafer. That is, the second wafer may be an electrical IC or a photonic chip that includes various metal routing layers, electrical circuitry, waveguides, optical modulators, optical detectors, and the like. As a result, limited space in the second wafer may only permit forming internal decoupling capacitors with small capacitances. In the embodiments described below, however, the decoupling capacitor in the first wafer can be formed with a large capacitance which might mean that external decoupling capacitors do not have to be used (or at least, relied on less).

In one embodiment, after bonding the first and second wafers to form a combination wafer, one or more vias are formed through the second wafer to establish an electrical connection between the decoupling capacitor and bond pads on a first surface of the second wafer. An electrical IC can then be flip chipped bonded to the first surface. As part of coupling the decoupling capacitor to the electrical IC, the decoupling capacitor is connected between the positive and negative power rails of a power source (e.g., VDD and VSS)

that provides power to the electrical IC. Because the decoupling capacitor is integrated with the combination wafer that is in turn flipped chipped bonded to the electrical IC, the integrated decoupling capacitor may be located closer to the circuitry in the electrical IC relative to using an external decoupling capacitor, thereby improving its effectiveness.

FIG. 1 illustrates bonding two wafers to form an integrated decoupling capacitor, according to one embodiment described herein. The combination wafer 100 includes a first wafer 105 that is bonded to a second wafer 120. The first wafer 105 includes an electrically driven component 110 that is controlled by a drive signal provided by a driver in an electrical IC (not shown). In one embodiment, the first wafer 105 is a photonic wafer where the driven component 110 is an optical modulator or optical detector (e.g., an optical device). The photonic wafer may be a silicon photonic chip or a III-V photonic chip. In another embodiment, the first wafer 105 is an electrical IC where the driven component 110 is circuitry that is coupled to circuitry in another electrical IC (not shown).

In one embodiment, the second wafer 120 is a semiconductor wafer that includes a decoupling capacitor (DECAP) 130 disposed on a substrate 125. In later processing steps described below, the DECAP 130 is coupled between the rails of a power source that delivers power for the electrical IC (not shown) containing a driver from driving the component 110. The DECAP 130 can be used with other integrated DECAPs and external DECAPs. For example, the first wafer 105 may also include internal DECAPs which can be coupled between the rails of the same power source as the DECAP 130—i.e., the capacitances are combined to form a larger, effective DECAP. In one embodiment, the second wafer 120 has multiple metal layers and via connections formed between the metal layers prior to bonding the second wafer 120 to the first wafer 105.

The first wafer 105 includes a bonding surface 115 and the second wafer 120 includes a bonding surface 135 where wafer bonding is performed. In one embodiment, the bonding surfaces 115, 135 may be formed from an oxide or other insulator suitable for wafer bonding. In another example, the bonding surfaces 115, 135 may include metal bond pads (e.g., copper bond pads) which are coupled together when performing wafer bonding.

Figure 2A:
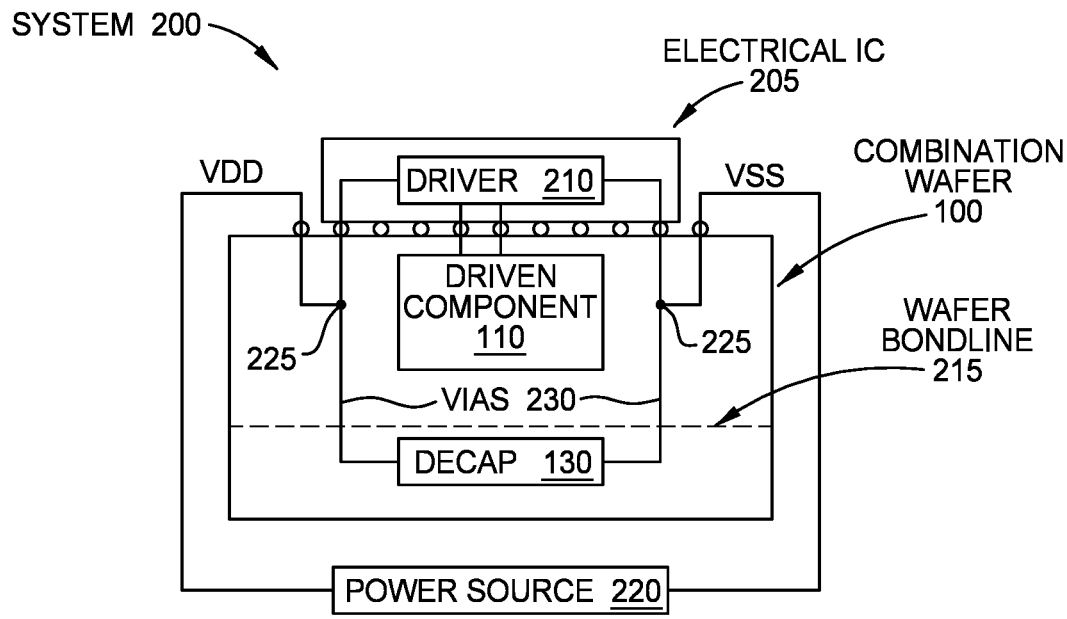
FIGS. 2A and 2B illustrate coupling integrated decoupling capacitors to drivers in electrical ICs, according to one embodiment described herein.
Figure 2B:
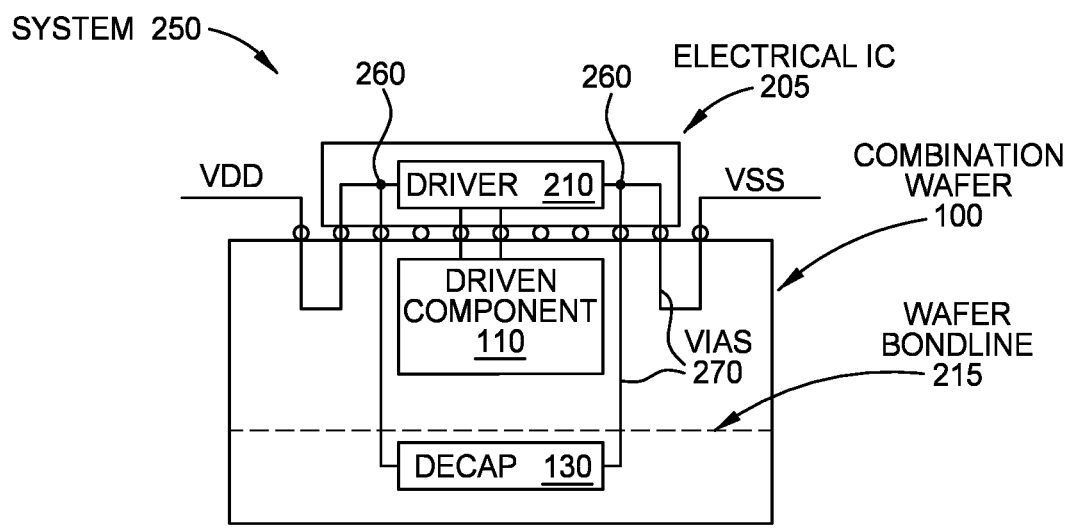

FIGS. 2A and 2B illustrate coupling integrated decoupling capacitors 130 to drivers 210 in electrical ICs 205, according to one embodiment described herein. In FIG. 2A, the electrical IC 205 is solder bonding (e.g., flipped chipped bonded) to a combination wafer 100 formed from bonding the first wafer 105 to the second wafer 120. Although not shown, the top surface of the combination wafer 100 may have bond pads used to formed solder bump connections to the electrical IC 205. These solder bump connections provide electrical connections between the driver 210 and the various components in the combination wafer 100.

As shown, the combination wafer 100 includes vias 230 that connect the various components in the combination wafer 100 to external components. For example, the vias 230 connect the DECAP 130 to a power source 220 and to the driver 210. Vias 230 can also be used to connect the driver 210 to the driven component 110 so that the driver 210 can provide drive signals to the driven component 110. As shown, some of the vias 230 extend through a wafer bond line 215 indicating where the first and second wafers forming the combination wafer 100 were bonded.

In this example, the power source 220 provides power (e.g., DC power) to the driver 210, which in turn provides control or data signals (e.g., AC signals) to the driven component 110. For example, assuming the combination wafer 100 is a photonic platform, the driver 210 may generate control signals for performing optical modulation in the driven component 110. In another example, the combination wafer 100 may be an electrical system (without any optical signals) where the driver 210 generates control signals for performing electrical modulation, operating a memory device, operating a processing element, or other electrical circuitry disposed in the first wafer 105.

The DECAP 130 is electrically coupled between VSS and VDD, thereby suppressing noise in those power signals. Because the DECAP 130 was formed on a separate wafer, it may have a larger capacitance than other internal or integrated capacitors in the combination wafer 100 (e.g., any internal DECAPs in the second wafer) and any internal DECAPs that may be in the electrical IC 205.

In one embodiment, the power source 220 is wire bonded to the top surface of the combination wafer 100 in order to introduce the VDD and VSS power signals into the wafer 100. VDD and VSS are then connected to the power source 220 at connection points 225 that are within the combination wafer 100. That is, the combination wafer 100 can include routing layers (not shown) so that the vias 230 connected to the DECAP 130 are electrically connected to the vias 230 coupled to VSS and VDD.

FIG. 2B is similar to FIG. 2A except that the DECAP 130 is electrically connected to VDD and VSS in the electrical IC 205 as shown by the connections 260, rather than in the combination wafer 100. That is, the combination wafer 100 includes vias 270 for electrically connecting VDD, VSS, and the DECAP 130 to the driver 210 in the electrical IC 205. However, instead of the combination wafer 100 include routing layers for electrically coupling VDD and VSS to the DECAP 130, the electrical IC 205 includes routing layers for coupling VDD and VSS to the DECAP 130. Thus, in this embodiment, the vias 270 connected to the DECAP 130 are electrically insulated from the vias 270 connected to VDD and VSS within the combination wafer 100.

Regardless whether the DECAP 130 is connected to VDD and VSS in the combination wafer 100 (as shown by the system 200 in FIG. 2A) or in the electrical IC 205 (as shown by the system 250 in FIG. 2B), the result is the same where the DECAP 130 is electrically coupled between VDD and VSS. In one embodiment, the DECAP 130 has a capacitance sufficient to reduce current spikes when switching the driver 210 that can be as large as 1-3 amps.

Figure 3A:
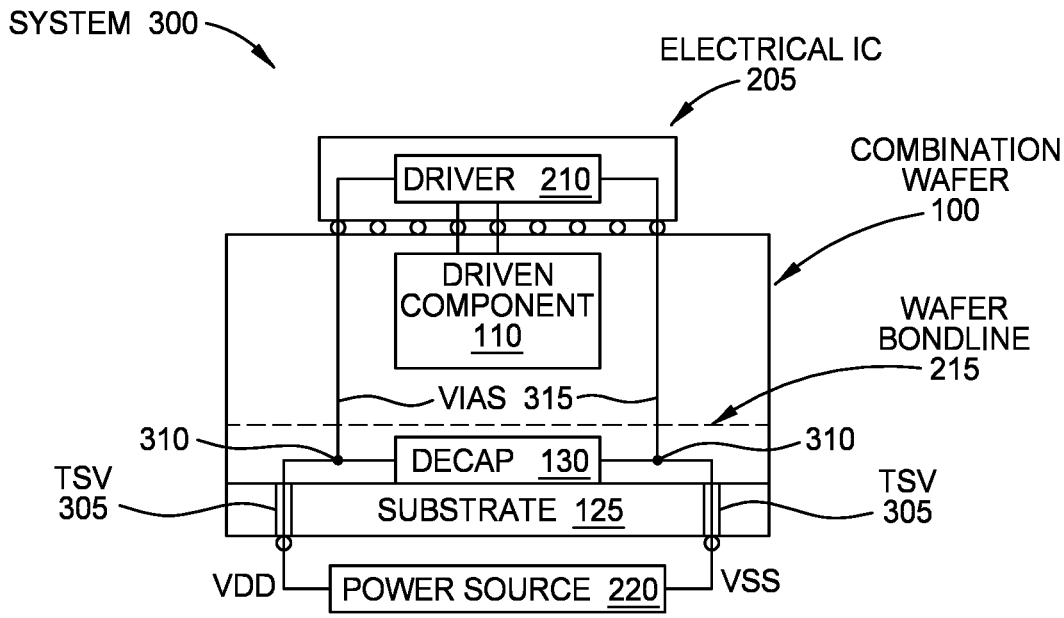
FIGS. 3A and 3B illustrate coupling integrated decoupling capacitors to drivers in electrical ICs, according to one embodiment described herein.
Figure 3B:
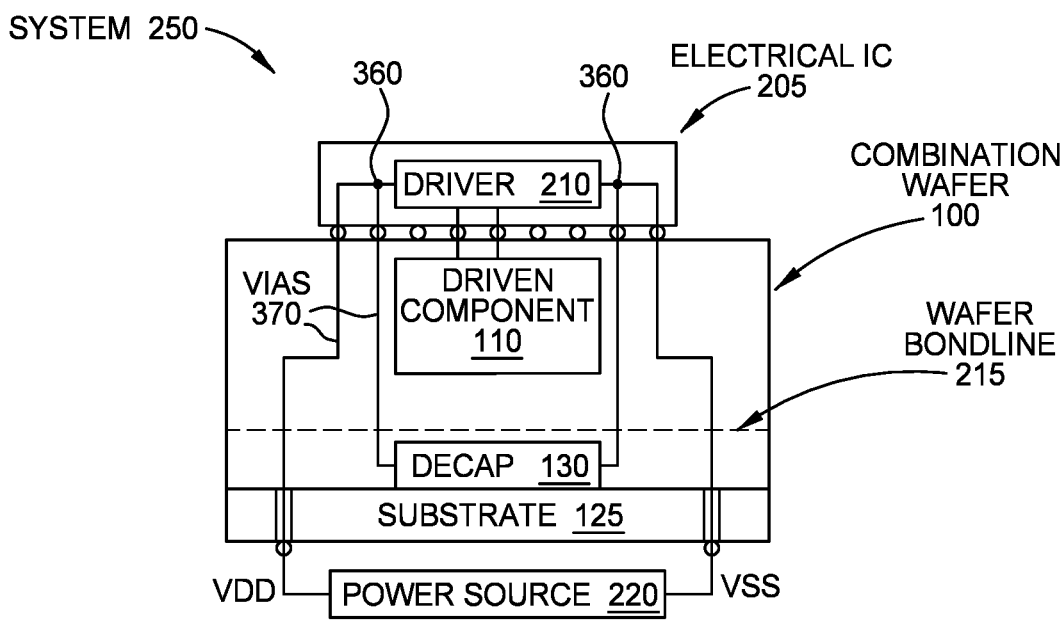

FIGS. 3A and 3B illustrate coupling integrated decoupling capacitors to drivers in electrical ICs, according to one embodiment described herein. FIG. 3A illustrates a system 300 similar to FIG. 2A except that the power source 220 is electrically coupled to the combination wafer 100 using a bottom surface rather than a top surface. For example, rather than wire bonding the power source 220 to the top surface, the combination wafer 100 include through silicon vias (TSVs) 305 that extend through the substrate 125. However, the material of the substrate 125 is not limited to silicon and can be any material that can provide structural support to the combination wafer 100 and can include through vias—e.g., the TSVs 305.

The TSVs 305 are coupled to solder bumps which are in turn coupled to VDD and VSS of the power source 220. In one embodiment, the power source 220 is disposed in an interposer or printed circuit board (PCB) that is soldered to the bottom surface of the combination wafer 100. The combination wafer 100 also includes vias 315 that connect VDD, VSS, and the DECAP 130 to the driver 210 in the electrical IC 205. In this example, the combination wafer 100 can include a routing layer that electrical connects VDD and VSS to the DECAP 130 within the combination wafer 100. The electrical connections between the DECAP 130 and VDD and VSS are represented by the connection points 310.

FIG. 3B is similar to FIG. 3A except that the DECAP 130 is electrically coupled to VDD and VSS within the electrical IC 205 at the connection points 360 rather than in the combination wafer 100. That is, the combination wafer 100 can include one or more vias 370 (and routing layers) that connect VDD, VSS, and the DECAP 130 to the electrical IC 205, but these vias 370 are insulated from each other so that the DECAP 130 is not electrically connected to VDD and VSS within the combination wafer 100. Instead, the electrical IC 205 can include routing layers that electrically connect the DECAP 130 to VDD and VSS.

Figure 4A:
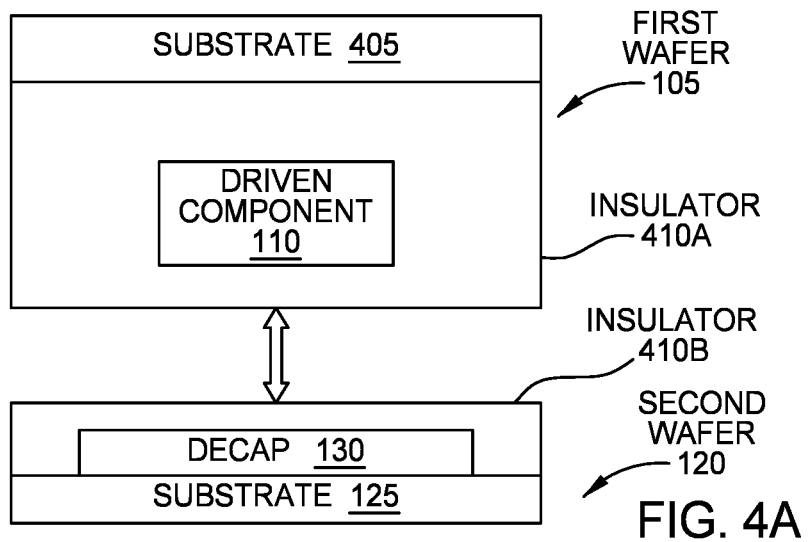
FIGS. 4A-4C illustrate a method for forming an integrated decoupling capacitor, according to one embodiment described herein.
Figure 4B:
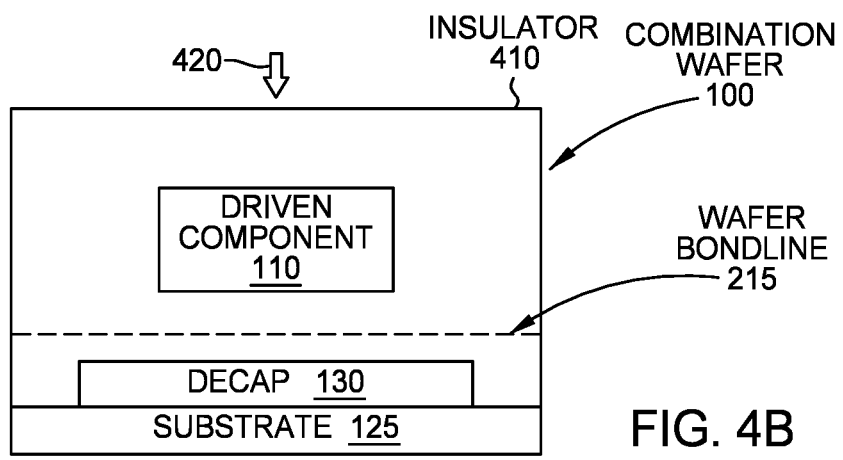
Figure 4C:
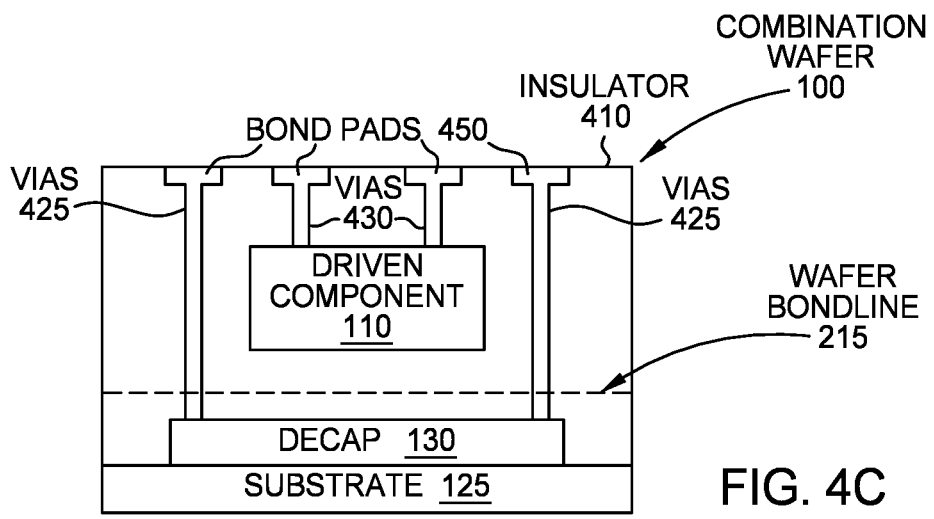

FIGS. 4A-4C illustrate a method for forming an integrated DECAP, according to one embodiment described herein. FIG. 4A illustrates wafer bonding the first wafer 105 to the second wafer 120. In this example, the first wafer 105 includes a substrate 405 which may be a semiconductor substrate (e.g., silicon or a III-V) on which is disposed an insulator 410A containing the driven component 110. Although not shown here, the first wafer 105 may have been subjected to multiple processing steps in order to form the driven component 110 within the insulator 410A. Further, while a single component 110 is shown in the insulator 410A, the first wafer 105 may have multiple optical or electrical components that are interconnected using waveguides, traces, vias, or routing layers. As mentioned above, the first wafer 105 may be photonic wafer or an electrical wafer.

The second wafer 120 includes the DECAP 130 embedded within an insulator 410B. Using a wafer bonding process, the insulator 410A is bonded to the insulator 410B to form a single bonded wafer (i.e., a combination wafer). In one embodiment, the insulators 410A and 410B are the same material—e.g., an oxide. Further, the embodiments are not limited to any particular oxide-oxide wafer bonding process or material.

The result of bonding the wafers 105 and 120 is illustrated in FIG. 4B where the insulator 410A and 410B has now been combined into a continuous insulator 410 as part of the wafer bonding process. The original interface between the two wafers is illustrated by the wafer bond line 215.

In one embodiment, the second wafer 120 is a handler wafer (or a bulk wafer) that provides additional support to the components in the first wafer 105. FIG. 4B also illustrates removing the substrate 405 from the first wafer 105 as shown by the arrow 420, while the substrate 125 continues to provide support to the combination wafer 100. The substrate 405 can be removed using any removal process such as chemical mechanically polishing (CMP), wafer grinding/thinning, or reactive ion etching (RIE). Removing the substrate 405 exposes a top surface of the insulator 410 for further processing steps.

FIG. 4C illustrates forming vias 425 and 430 through the insulator 410 of the combination wafer 100. The vias 425 extend through the first wafer 105, the bond line 215, and connect to the DECAP 130. While the vias 425 are shown connecting to the DECAP 130 directly, in other embodiments, the vias 425 may connect to a routing layer which is in turn connected to the DECAP 130. The vias 425 are used to connect the DECAP 130 to the electrical IC (not shown) that is coupled to the top surface in later processing steps. In one embodiment, the distance from the DECAP 130 to the top surface of the first wafer 105 (which may be the length of the vias 425) is around 10-20 microns. Moreover, which FIG. 4C illustrates two vias 425 (which can be respectively coupled to VDD and VSS), the vias 425 may include multiple parallel vias to reduce the resistance and the inductance between the DECAP 130 and the circuitry in the electrical IC (not shown).

The vias 430 extend from the top surface of the insulator 410 and electrical connect the driven component 110 either directly or indirectly using, e.g., a metal routing layer. The vias 425 and 430 are coupled to respective bond pads 450 at the top surface of the insulator 410. The bond pads 450 include a conductive material (e.g., a metal) and provide a suitable contact point for solder bonding the combination wafer 100 to an electrical IC.

In one embodiment, the combination wafer 100 is diced or sawed to create multiple platforms. For example, the combination wafer 100 may contain tens or hundreds of the same components illustrated in FIG. 4C. The combination wafer 100 can then be diced or sawed to form different wafer portions (e.g., first wafer portions bonded to second wafer portions) that are each attached to a respective electrical IC at the top surface of the insulator. That is, the combination wafer 100 can be diced into multiple portions, where each portion is formed by a first wafer portion bonded to a second wafer portion. FIG. 4C can illustrate one such portion of the combination wafer 100. These portions can then be then be bonded to respective electrical ICs before or after the combination wafer 100 is diced or sawed.

Figure 5A:
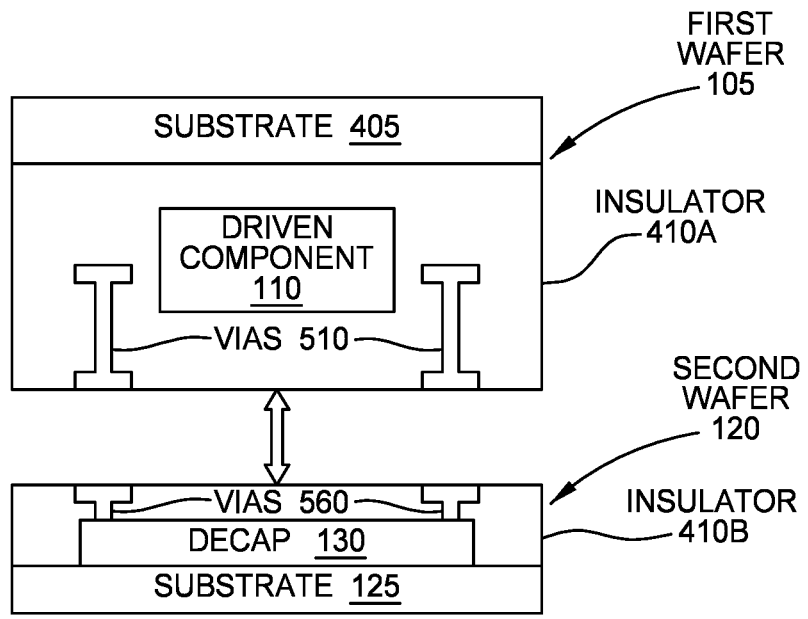
FIGS. 5A and 5B illustrate a method for forming an integrated decoupling capacitor, according to one embodiment described herein.
Figure 5B:
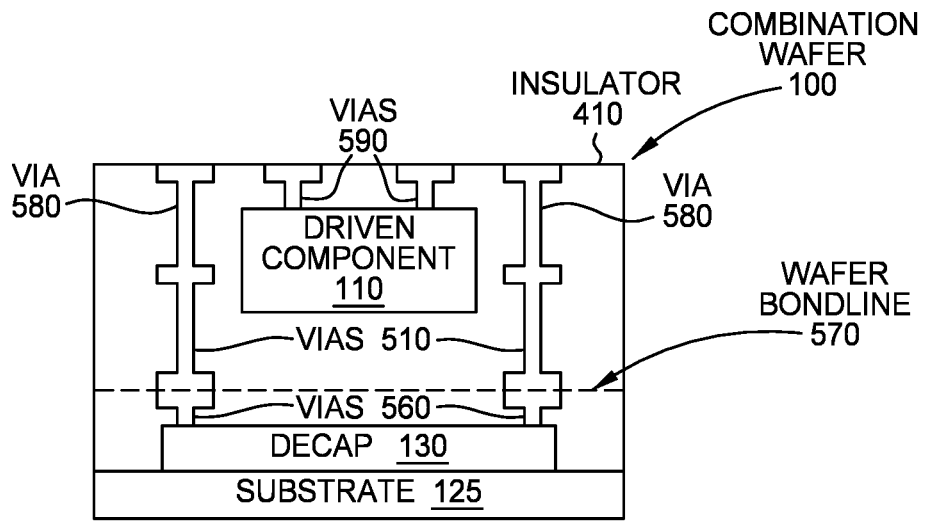

FIGS. 5A and 5B illustrate a method for forming an integrated DECAP 130, according to one embodiment described herein. FIG. 5A illustrates a first wafer 105 that includes the substrate 405 on which the insulator 410A is disposed (similar to the first wafer 105 illustrated in FIG. 4A). In addition to including the driven component 110, the insulator 410A also includes vias 510. In one embodiment, the vias 510 extend from an internal layer (e.g., a metal routing layer) in the first wafer 105 to a bottom surface of the first wafer 105.

FIG. 5A also includes a second wafer 120 that includes the DECAP 130 disposed on the substrate 125. The insulator 410B in FIG. 5A includes vias 560 that extend from the DECAP 130 (or a routing layer coupled to the DECAP 130) to a top surface of the second wafer 120.

When bonding the first wafer 105 to the second wafer 120, the vias 510 are aligned to the vias 560 so that metallic connections of the vias 510 and 560 are brought into contact and form an electrical connection. Bonding the insulators 410A and 410B and bonding the vias 510 and 560 is referred to as a metal-metal/oxide-oxide wafer bond. In one embodiment, the metallic connections of the vias 510 and 560 being bonded at the bond line are copper thereby forming a Cu—Cu/oxide-oxide wafer bond. The remaining portions of the vias 510 and 560 may include other materials besides copper. Further, copper is just one example of a material suitable for bonding the vias 510 and 560 and other conductive materials can be used.

FIG. 5B illustrates the result of performing the metal-metal/oxide-oxide wafer bond in FIG. 5A at the bond line 570. As shown, the vias 510 are electrically connected to the vias 560. Moreover, the insulators 410A and 410B are joined to form a continuous insulator 410.

Once bonded, a substrate removal process is used to remove the substrate 405. This process can use any of the techniques described above in FIG. 4B. Removing the substrate 405 exposes a top surface of the insulator 410. The vias 580 and 590 are also formed (which may be done after the substrate 405 has been removed). The vias 580 connect the top surface of the insulator 410 to the vias 510, and as a result, the vias 580 are electrically connected to the DECAP 130. In this manner, some of the vias used to connect the top surface of the insulator 410 to the DECAP 130 can be formed before wafer bonding is performed. After wafer bonding is performed, the vias 580 can be formed to complete the electrical connection between the DECAP 130 and the top surface of the insulator 410. While FIG. 5B illustrates the vias 580, 510, and 560 being directly connected, these vias may be indirectly connected using one or more routing layers.

The vias 590, on the other hand, connect the top surface of the insulator 410 to the driven component 110. Although not shown, the vias 580 and 590 can include bond pads for electrically connecting the combination wafer 100 to an electrical IC.

Figure 6A:
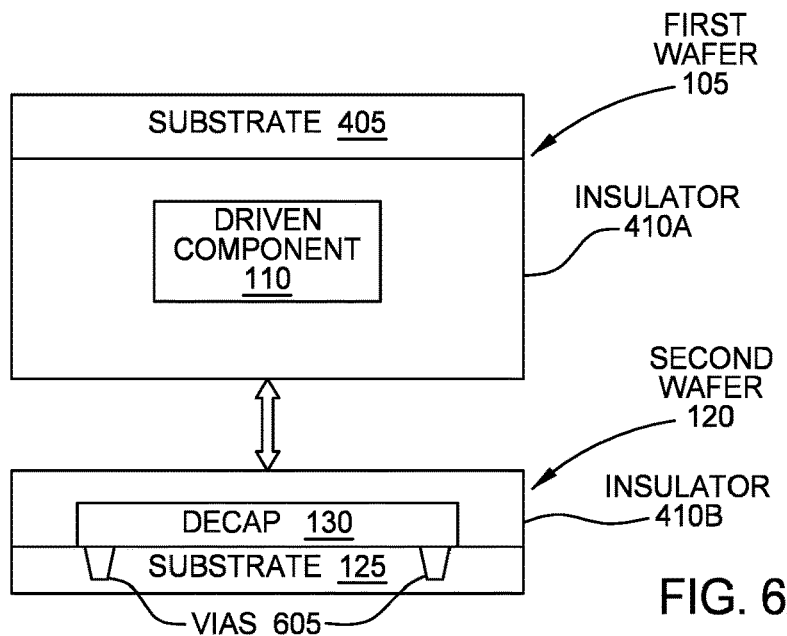
FIGS. 6A-6C illustrate a method for forming an integrated decoupling capacitor, according to one embodiment described herein.
Figure 6B:
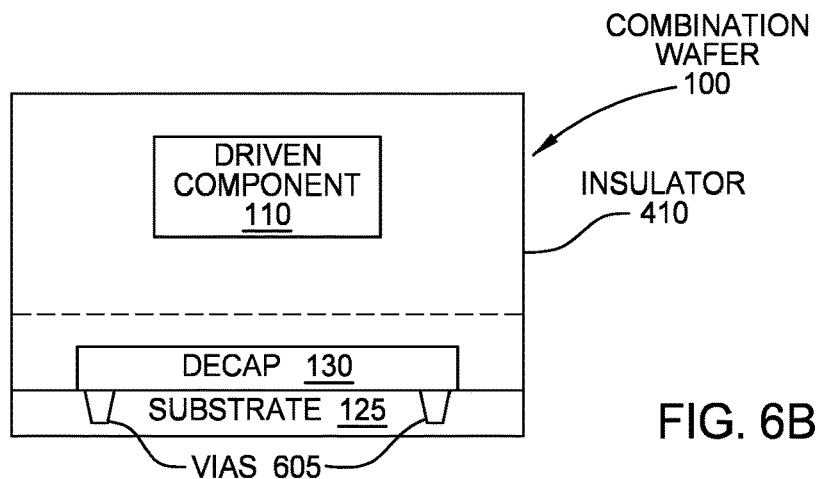
Figure 6C:
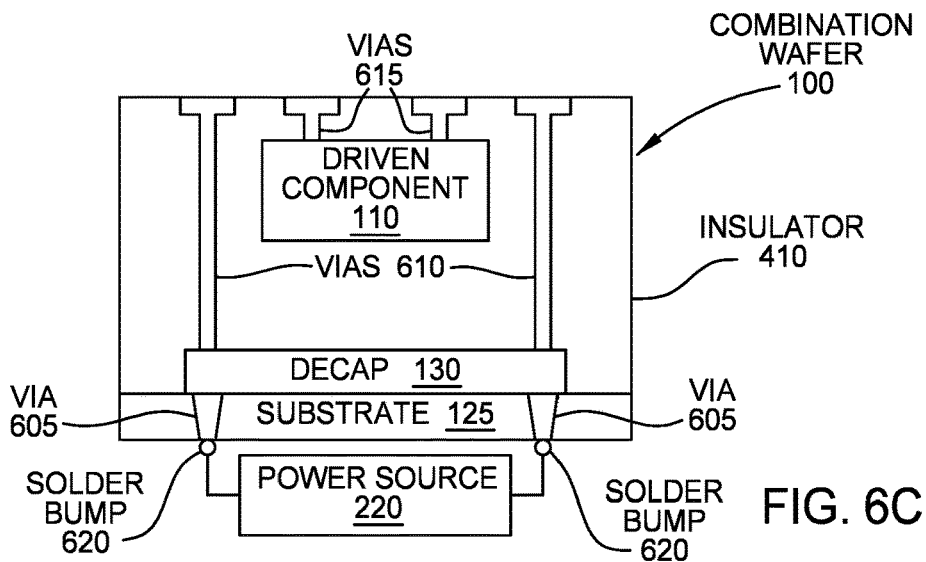

FIGS. 6A-6C illustrate a method for forming an integrated DECAP 130, according to one embodiment described herein. The first wafer 105 in FIG. 6A has the same arrangements as the first wafer 105 in FIG. 4A. The second wafer 120 however is different from the second wafers illustrated in FIGS. 4A and 5A. In this example, the substrate 125 includes two vias 605 which connect one side to the DECAP 130 and extend partially through the substrate 125. While in this example the vias 605 do not extend completely through the substrate 125, in other embodiments, the vias 605 can extend completely through the substrate 125.

As discussed above, an oxide-oxide wafer bonding is performed by bonding the insulator 410A of the first wafer 105 to the insulator 410B of the second wafer 120.

In one embodiment, the methods illustrated in FIGS. 4A-4C and 5A-5B correspond to the arrangement in FIGS. 2A and 2B where power is delivered to the electrical IC and the DECAP 130 using connections at the top surface of the combination wafer 100. For example, the vias 425 in FIG. 4C may route electrical power from the electrical IC to the DECAP 130 similar to the arrangement shown in FIG. 2B. In another embodiment, the vias 425 may be connected via a routing layer to other vias in the combination wafer that are connected to VDD and VSS similar to the arrangement illustrated in FIG. 2A. Similar connections as shown in FIGS. 2A and 2B can be made using the vias 510, 560, and 580 illustrated in FIG. 5B.

FIG. 6B illustrates the result of performing the wafer bonding in FIG. 6A. The resulting combination wafer 100 is the same as in FIG. 4B where the insulators 410A and 410B are combined to form one continuous insulator 410. Further, the substrate 405 has been removed.

The combination wafer 100 is further processed in FIG. 6C to add the vias 610 and 615 as well as connecting the vias 605 in the substrate 125 to the power source 220. The vias 610 connect the top surface of the insulator 410 to the DECAP 130 either directly or indirectly using, e.g., a routing layer. Further, the vias 615 connect the top surface of the insulator 410 to the driven component 110.

In one embodiment, some of the substrate 125 is removed so that the vias 605 are exposed at a bottom surface of the combination wafer 100. Bond pads can then be formed and are used to connect the DECAP 130 to the power source 220 using solder bumps 620. For example, the solder bumps 620 may physically and electrically connect the combination wafer 100 to a PCB or interposer (not shown) that includes various layers for routing electrical power from the power source 220 to the vias 605 and to the DECAP 130.

In one embodiment, the vias 605 and the solder connections provide an electrical connection between the power source 220 and the DECAP 130. In turn, the vias 610 provide an electrical connection between the DECAP 130 and an electrical IC mounted onto the top of the insulator 410. In this manner, the platform illustrated in FIG. 6C can be connected to an electrical IC using the arrangements shown in FIG. 3A. However, in another embodiment, the vias 605 in the substrate 125 may bypass the DECAP 130 and instead connect to vias that couple the power source 220 to the top surface of the electrical IC as shown in FIG. 3B. The vias 610 can then be used to route the power from the electrical IC to the DECAP 130. Thus, while FIG. 6A-6C illustrates that the vias 605 in the substrate 125 are connected to the DECAP 130 directly, this is not a requirement.

Figure 7A:
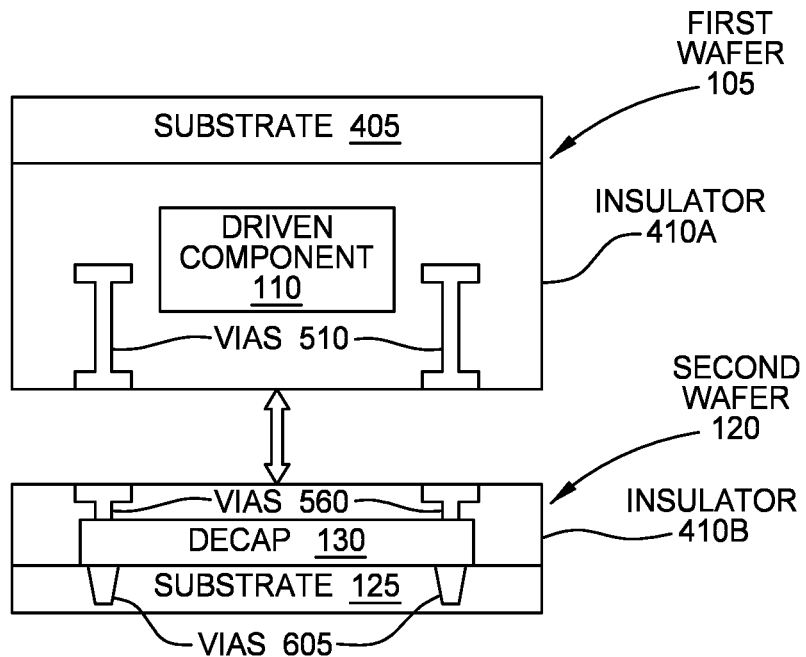
FIGS. 7A and 7B illustrate a method for forming an integrated decoupling capacitor, according to one embodiment described herein.
Figure 7B:
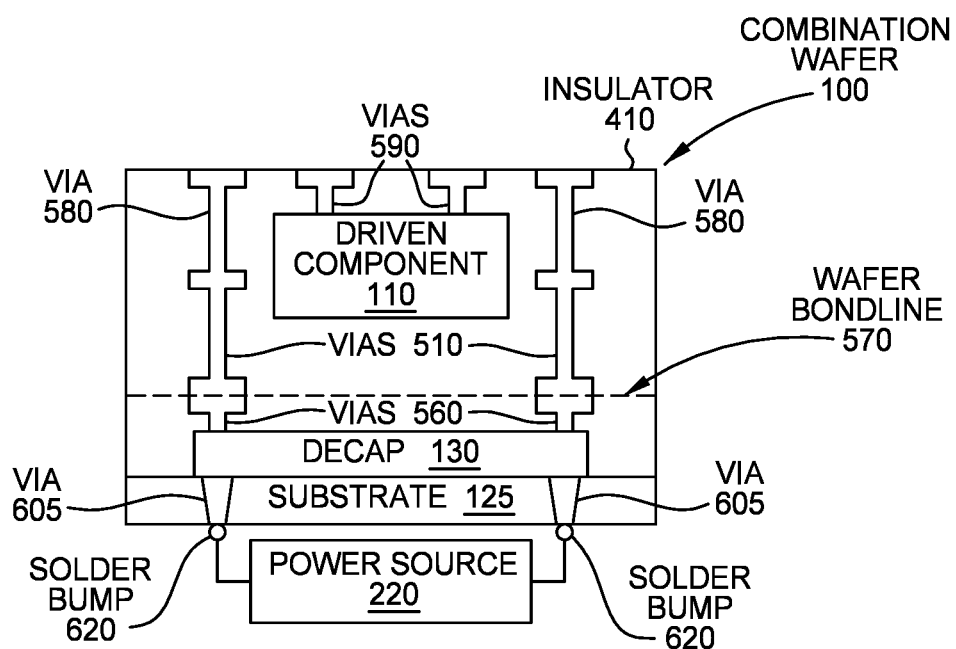

FIGS. 7A and 7B illustrate a method for forming an integrated decoupling capacitor, according to one embodiment described herein. FIG. 7A illustrates first and second wafers 105 and 120 with similar components as the first and second wafers illustrated in FIG. 5A except that the second wafer 120 in FIG. 7A includes vias 605 which extend at least partially into the substrate 125. Like in FIG. 5A, the first and second wafers 105 and 120 in FIG. 7A can be bonded using a metal-metal/oxide-oxide wafer bond.

FIG. 7B illustrates a combination wafer 100 that is similar to the combination wafer 100 in FIG. 5B except with the addition of the vias 605 and the solder bumps 620 which electrical connect the bottom of the combination wafer 100 to the power source 220. Thus, unlike in FIG. 5B where the combination wafer 100 may receive power via the top surface, in FIG. 7B the combination wafer 100 receives power via its bottom surface which may be coupled to a PCB or interposer. Further, the vias 510, 560, 580, and 605 in FIG. 7B can be connected according to FIG. 3A or 3B. That is, these vias can be connected so that the DECAP 130 receives the power from the power source 220 before the power is routed to the electrical IC (as illustrated in FIG. 3A) or the DECAP 130 can receive the power from the electrical IC (as illustrated in FIG. 3B).

Figure 8:
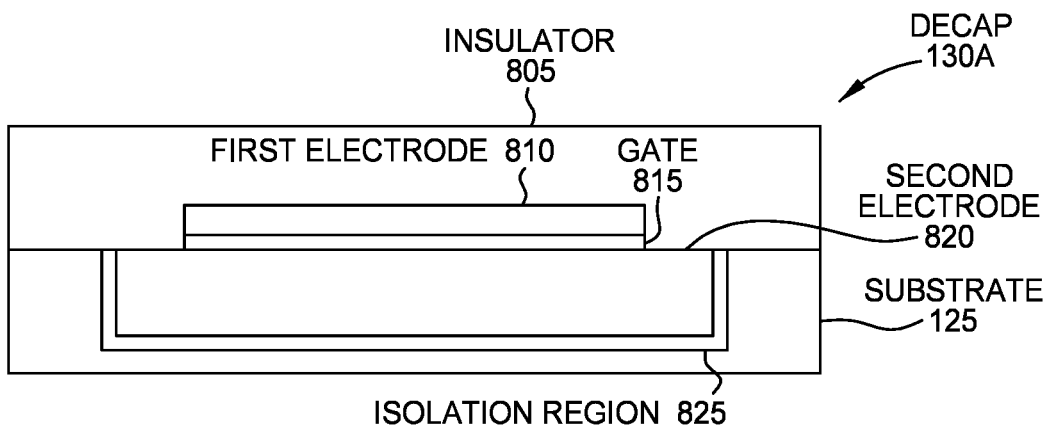
FIGS. 8-10 illustrate different types of decoupling capacitors, according to one embodiment described herein.
Figure 9:
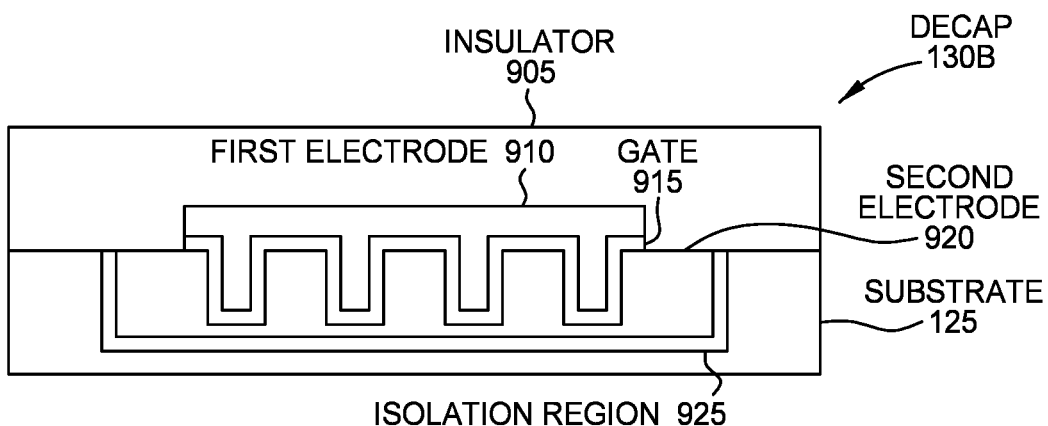
Figure 10:
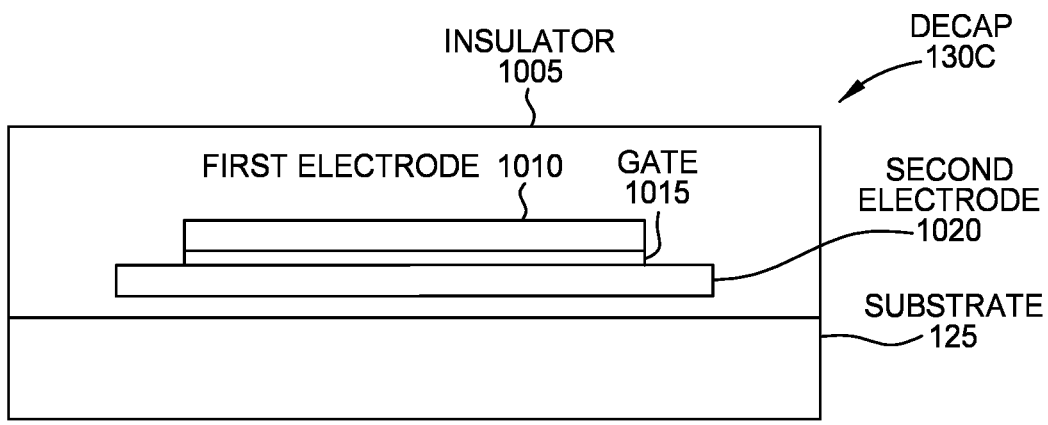

FIGS. 8-10 illustrate different types of DECAPs, according to one embodiment described herein. FIG. 8 illustrates a DECAP 130A that uses a metal oxide semiconductor capacitor (MOSCAP) structure. The DECAP 130A includes a first electrode 810, a gate 815, and a second electrode 820. The first electrode 810 and the gate 815 are embedded within an insulator 805 (e.g., the insulator 410 discussed above). The first electrode 810 may be formed from a metal or a heavily doped material (e.g., doped polysilicon). In general, the first electrode 810 can be any conductive material. The gate 815 can be any insulative material that electrically isolates the first and second electrodes 810 and 820, thereby forming the capacitance of the DECAP 130A. In one embodiment, the gate 815 is a dielectric material such as oxide, SiN or high K dielectric materials such as HfO2. Further, the thickness of the gate 815 can be optimized for the specific application of the DECAP 130A.

The second electrode 820 is formed in the substrate 125. Because a voltage potential is applied to the second electrode 820 (e.g., either VSS or VDD), it may be desired that the second electrode 820 is electrically isolated from the remainder of the substrate 125 via an isolation region 825. In one embodiment, the second electrode 820 is made from the same material as the substrate 125 (e.g., a semiconductor such as silicon). The second electrode 820 may be heavily doped to serve as a conductive electrode for the DECAP 130A.

The DECAP 130A is also compatible with the methods illustrated in FIGS. 4 and 5 where the platform receives power via a top surface, and in FIGS. 6 and 7 where the platform receives power via a bottom surface. That is, the DECAP 130A can be coupled either directly or indirectly via a routing layer to vias that extend up through the insulator 805 until reaching a top surface or down through the substrate 125 until reaching a bottom surface.

FIG. 9 illustrates a DECAP 130B with a 3D microelectromechanical system (MEMS) structure. The DECAP 130B includes a first electrode 910, a gate 915, and a second electrode 920. At least some portions of the first electrode 910 and the gate 915 are embedded within an insulator 905 (e.g., the insulator 410 discussed above) while other portions are embedded in the substrate 125. The first electrode 910 may be formed from a metal or a heavily doped material (e.g., doped polysilicon). In general, the first electrode 910 can be any conductive material.

The gate 915 can be any insulative material that electrically isolates the first and second electrodes 910 and 920, thereby forming the capacitance of the DECAP 130B. In this embodiment, the gate 915 and the first electrode 910 form a square tooth pattern that may increase the overall contact area relative to using the MOSCAP structure of DECAP 130A in FIG. 9. As a result, for the same space, the DECAP 130B may have increased capacitance relative to the DECAP 130A.

The second electrode 920 is formed in the substrate 125. Because a voltage potential is applied to the second electrode 920 (e.g., either VSS or VDD), it may be desired that the second electrode 920 be electrically isolated from the remainder of the substrate 125 via an isolation region 925. In one embodiment, the second electrode 920 is made from the same material as the substrate 125 (e.g., a semiconductor such as silicon).

The DECAP 130B is also compatible with the methods illustrated in FIGS. 4 and 5 where the platform receives power via a top surface and in FIGS. 6 and 7 where the platform receives power via a bottom surface. That is, the DECAP 130B can be coupled either directly or indirectly via a routing layer to vias that that extend up through the insulator 905 until reaching a top surface, or down through the substrate 125 until reaching a bottom surface.

FIG. 10 illustrates a DECAP 130C implemented as a metal-insulator-metal capacitor (MIMCAP). The DECAP 130C includes a first electrode 1010, a gate 1015, and a second electrode 1020. In this example, the first electrode 1010, the gate 1015, and the second electrode 1020 are embedded within an insulator 1005 (e.g., the insulator 410 discussed above). Thus, unlike in FIG. 8 where the second electrode is part of (or embedded within) the substrate 125, in FIG. 10 the second electrode 1020 is formed above the substrate 125.

The first and second electrodes 1010, 1020 may be formed from a metal or a heavily doped material (e.g., doped polysilicon). In general, the first and second electrodes 1010, 1020 can be any conductive material. The gate 1015 can be any insulative material that electrically isolates the first and second electrodes 1010 and 1020, thereby forming the capacitance of the DECAP 130C.

The DECAP 130C is also compatible with the methods illustrated in FIGS. 4 and 5 where the platform receives power via a top surface and in FIGS. 6 and 7 where the platform receives power via a bottom surface. That is, the DECAP 130C can be coupled either directly or indirectly via a routing layer to vias that that extend up through the insulator 1005 until reaching a top surface, or down through the substrate 125 until reaching a bottom surface. Further, a MIMCAP can also be made using multiple metal/insulator/metal layers (not shown) and can be stacked on each other to increase capacitance per unit area.

In one embodiment, the DECAPs 130A-C in FIGS. 8-10 are formed in the wafers (e.g., the second wafer 120 discussed above) before the wafer is bonded to another wafer (e.g., the first wafer 105). As a result, the fabrication steps used to form the DECAPs 130A-C are not limited by the components that may be in the other wafer. For example, the first wafer 105 may include components that are sensitive to temperature. Thus, forming the DECAPs 130A-C in the same wafer that includes temperature sensitive components can limit the temperatures used to form the DECAPs 130A-C. However, by forming the DECAPs 130A-C separately, the fabrication process is not limited by sensitive components.

In the current disclosure, reference is made to various embodiments. However, the scope of the present disclosure is not limited to specific described embodiments. Instead, any combination of the described features and elements, whether related to different embodiments or not, is contemplated to implement and practice contemplated embodiments. Additionally, when elements of the embodiments are described in the form of "at least one of A and B," it will be understood that embodiments including element A exclusively, including element B exclusively, and including element A and B are each contemplated. Furthermore, although some embodiments disclosed herein may achieve advantages over other possible solutions or over the prior art, whether or not a particular advantage is achieved by a given embodiment is not limiting of the scope of the present disclosure. Thus, the aspects, features, embodiments and advantages disclosed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

In view of the foregoing, the scope of the present disclosure is determined by the claims that follow.

We claim:

1. A combination wafer, comprising:
a first wafer comprising an optical modulator; and
a second wafer comprising a decoupling capacitor,
wherein the first wafer and the second wafer are directly bonded along a wafer bond line,
wherein the first wafer comprises a plurality of vias that electrically connect the decoupling capacitor in the second wafer to bond pads disposed on a first side of the first wafer that is opposite the wafer bond line,
wherein the second wafer is a semiconductor wafer and the first wafer comprises a photonic chip that includes the optical modulator.

2. The combination wafer of claim 1, wherein an insulator of the first wafer is directly bonded to an insulator of the second wafer at the wafer bond line.

3. The combination wafer of claim 2, wherein the plurality of vias extend through the insulator of the first wafer and the insulator of the second wafer.

4. The combination wafer of claim 2, wherein a first plurality of metallic connections in the insulator of the first wafer are directly bonded to a second plurality of metallic connections in the insulator of the second wafer at the wafer bond line, wherein first vias of the plurality of vias are coupled to the first plurality of metallic connections and second vias of the plurality of vias are coupled to the second plurality of metallic connections.

5. The combination wafer of claim 1, wherein the decoupling capacitor is coupled between a positive power rail and a negative power rail.

6. The combination wafer of claim 5, wherein one of: (i) the negative power rail and the positive power rail are coupled to the combination wafer via bond pads disposed at the first side of the first wafer or (ii) the negative power rail and the positive power rail are coupled to the second wafer at a bottom surface of the second wafer that is opposite the wafer bond line.

7. A platform, comprising:
a first wafer portion comprising an electrically driven component;
a second wafer portion comprising a decoupling capacitor, wherein the first wafer portion and the second wafer portion are bonded along a bond line,
a plurality of vias, wherein the plurality of vias extend through the first wafer portion and extend into the second wafer portion in order to electrically connect the decoupling capacitor in the second wafer portion to bond pads disposed between a first side of the first wafer portion that is opposite the bond line and an electrical IC; and
the electrical IC coupled to the bond pads.

8. The platform of claim 7, wherein an insulator of the first wafer portion is directly bonded to an insulator of the second wafer portion at the bond line.

9. The platform of claim 8, wherein a first plurality of metallic connections in the insulator of the first wafer are directly bonded to a second plurality of metallic connections in the insulator of the second wafer at the wafer bond line, wherein first vias of the plurality of vias are coupled to the first plurality of metallic connections and second vias of the plurality of vias are coupled to the second plurality of metallic connections.

10. The platform of claim 7, wherein the electrical IC comprises circuitry for driving the electrically driven component in the first wafer portion, wherein the circuitry is coupled to at least two voltage rails, wherein the decoupling capacitor is coupled between the at least two voltage rails.

11. The platform of claim 10, wherein the electrically driven component comprises an optical device, wherein the first wafer portion comprises at least one waveguide optically coupled to the optical device.

12. The platform of claim 7, wherein the decoupling capacitor is coupled between a positive power rail and a negative power rail.

13. The platform of claim 12, wherein one of: (i) the negative power rail and the positive power rail are coupled to the first wafer via bond pads disposed at the first side of the first wafer or (ii) the negative power rail and the positive power rail are coupled to the second wafer at a bottom surface of the second wafer that is opposite the wafer bond line.

14. The platform of claim 7, wherein each of the plurality of vias extends through the first wafer portion and extends into the second wafer portion, in order to electrically connect the decoupling capacitor in the second wafer portion to the bond pads.

15. A platform, comprising:
a first wafer portion;
a second wafer portion comprising a decoupling capacitor, wherein the first wafer portion and the second wafer portion are bonded along a bond line,
a plurality of vias, wherein the plurality of vias extend through the first wafer portion and extend into the second wafer portion in order to electrically connect the decoupling capacitor in the second wafer portion to bond pads disposed on a first side of the first wafer portion that is opposite the bond line; and
an electrical IC coupled to the bond pads such that the first wafer is disposed between the electrical IC and the second wafer.

16. The platform of claim 15, wherein an insulator of the first wafer is directly bonded to an insulator of the second wafer at the wafer bond line.

17. The platform of claim 16, wherein a first plurality of metallic connections in the insulator of the first wafer are directly bonded to a second plurality of metallic connections in the insulator of the second wafer at the wafer bond line, wherein first vias of the plurality of vias are coupled to the first plurality of metallic connections and second vias of the plurality of vias are coupled to the second plurality of metallic connections.

18. The platform of claim 15, wherein the decoupling capacitor is coupled between a positive power rail and a negative power rail.

19. The platform of claim 18, wherein one of: (i) the negative power rail and the positive power rail are coupled to the first wafer via bond pads disposed at the first side of the first wafer or (ii) the negative power rail and the positive power rail are coupled to the second wafer at a bottom surface of the second wafer that is opposite the wafer bond line.

20. The platform of claim 15, wherein each of the plurality of vias extends through the first wafer portion and extends into the second wafer portion, in order to electrically connect the decoupling capacitor in the second wafer portion to the bond pads.

* * * * *